(12) United States Patent
Moll et al.

(10) Patent No.: US 10,395,981 B2
(45) Date of Patent: Aug. 27, 2019

(54) SEMICONDUCTOR DEVICE INCLUDING A LEVELING DIELECTRIC FILL MATERIAL

(71) Applicant: GLOBALFOUNDRIES Inc., Grand Cayman (KY)

(72) Inventors: Hans-Peter Moll, Dresden (DE); Jeremy Austin Wahl, Delmar, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 4 days.

(21) Appl. No.: 15/793,253

(22) Filed: Oct. 25, 2017

(65) Prior Publication Data

US 2019/0122921 A1   Apr. 25, 2019

(51) Int. Cl.
| | | |
|---|---|---|
| *H01L 21/768* | (2006.01) | |
| *H01L 21/28* | (2006.01) | |
| *H01L 29/66* | (2006.01) | |
| *H01L 29/04* | (2006.01) | |

(52) U.S. Cl.
CPC .. *H01L 21/76822* (2013.01); *H01L 21/28052* (2013.01); *H01L 21/76814* (2013.01); *H01L 21/76831* (2013.01); *H01L 21/76834* (2013.01); *H01L 21/76852* (2013.01); *H01L 21/76867* (2013.01); *H01L 21/76883* (2013.01); *H01L 29/045* (2013.01); *H01L 29/66507* (2013.01)

(58) Field of Classification Search
CPC ......... H01L 21/28097; H01L 21/28052; H01L 21/823443; H01L 21/82385; H01L 21/76801; H01L 21/76814; H01L 21/76822; H01L 21/76829; H01L 21/76834; H01L 21/76867; H01L 29/4933; H01L 29/4941; H01L 29/4975; H01L 29/665; H01L 29/66507; H01L 29/78618
See application file for complete search history.

(56) References Cited

U.S. PATENT DOCUMENTS

| | | | | |
|---|---|---|---|---|
| 6,153,485 A | * | 11/2000 | Pey | ................... H01L 21/28052 257/E21.199 |
| 9,349,833 B1 | * | 5/2016 | Hung | .................. H01L 29/4983 |
| 2007/0075374 A1 | * | 4/2007 | Kudou | ............ H01L 21/823443 257/365 |
| 2008/0135903 A1 | * | 6/2008 | Hu | ..................... H01L 21/28273 257/296 |
| 2010/0219478 A1 | * | 9/2010 | Manabe | ............ H01L 21/28097 257/369 |
| 2013/0189839 A1 | * | 7/2013 | Guillorn | ......... H01L 21/823814 438/675 |
| 2016/0204128 A1 | * | 7/2016 | Baars | .................... H01L 21/308 257/296 |

* cited by examiner

*Primary Examiner* — Thanhha S Pham
(74) *Attorney, Agent, or Firm* — Amerson Law Firm, PLLC

(57) ABSTRACT

The present disclosure relates to semiconductor devices and manufacturing techniques in which topography-related contact failures may be reduced by providing a dielectric fill material in a late manufacturing stage. In sophisticated semiconductor devices, the material loss in the trench isolation regions may result in significant contact failures, which may be reduced by levelling the device topography, thereby tolerating a significant lateral overlap of contact elements with trench isolation regions.

12 Claims, 11 Drawing Sheets

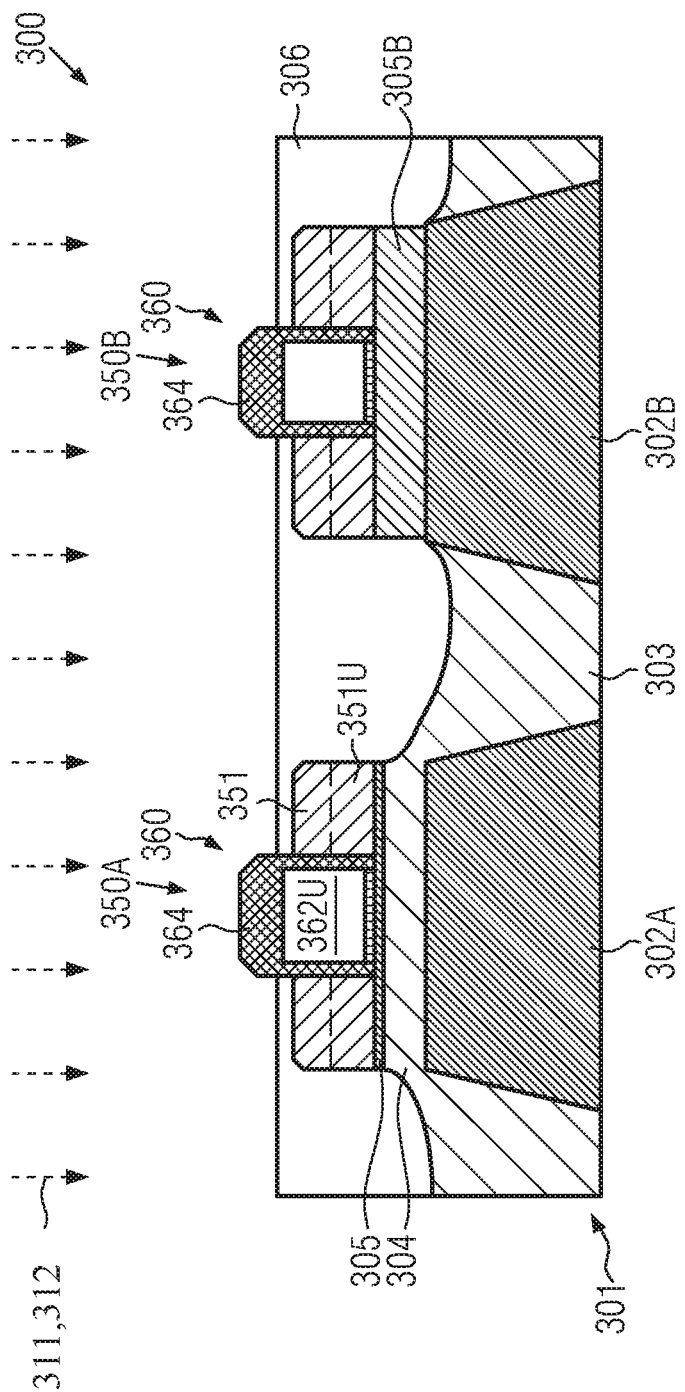

SEMICONDUCTOR DEVICE INCLUDING A LEVELING DIELECTRIC FILL MATERIAL

BACKGROUND

1. Field of the Disclosure

The present disclosure generally relates to the field of semiconductor devices and manufacturing techniques, and more particularly, to semiconductor devices including transistor elements formed on the basis of reduced critical dimensions, such as a gate length, of approximately 50 nm and less.

2. Description of the Related Art

Significant progress has been made in the field of semiconductor devices over the last decades, resulting in semiconductor devices including circuit elements, such as transistors, capacitors, resistors and the like, with critical dimensions in the device level of approximately 50 nm and even less, thereby providing the potential for forming integrated circuits with extremely high integration density. For example, control circuitry including several million transistor elements and more in a single integrated circuit may be fabricated. In other cases, an entire system may be formed on a single chip, thereby requiring the implementation of digital and analog circuit portions, frequently in combination with RF components.

Performance of individual circuit elements and superior integration density have mainly been improved by steadily reducing the lateral dimensions of circuit elements, such as transistor elements, capacitors, resistors, metal features in the metallization system and the like. One very important technology used in the field of semiconductor production is the CMOS technology, according to which transistor elements may be provided in the form of field effect transistors of P-type conductivity and N-type conductivity. Basically, a field effect transistor comprises a channel region, the conductivity of which is controlled by at least one control electrode, typically referred to as a gate electrode, which is connected to an appropriate control voltage. The channel region is, in sophisticated applications requiring extremely efficient small signal transistor elements, formed by a crystalline semiconductor material, typically a silicon or silicon/germanium material, which is connected to current injecting and receiving regions, typically referred to as source and drain regions. The dopant profile in the channel region and the drain and source regions is appropriately adjusted in order to provide a specified amount and direction of current flow between the source and the drain regions upon applying an appropriate control voltage to the gate electrode.

Although basically the continuous reduction of the size of the transistor elements has resulted in extremely high integration density in modern integrated circuits, the introduction of ever decreasing critical dimensions is not a straightforward development. Rather, it appears that many side effects associated with the shrinkage of device dimensions may have to be taken into consideration in order to not unduly offset the general advantages gained by reduced lateral device dimensions and increased packing density.

For example, the transistor elements and any other circuit elements that may be provided in the device level, i.e., in and above a respective crystalline semiconductor layer, such as a silicon layer, have to be appropriately interconnected with respect to the required function of the circuit design under consideration. Consequently, a complex "fabric" of electrical connections has to be provided above the semiconductor-based circuit elements so as to establish the many electrical connections between circuit elements and to the periphery of the integrated circuit or a circuit portion, which may typically be accomplished on the basis of a plurality of metallization layers that have to be provided in a stacked configuration, since typically the number of required interconnections between circuit elements increases overproportionally with respect to the number of circuit elements.

One important part of the complex structure of connections between circuit elements is represented by so-called contact elements, which may be considered as interface between the plurality of stacked metallization layers and the circuit elements formed in and above the respective semiconductor layer. For example, typically, the drain and/or source regions and the gate electrode structures have to be connected to other circuit elements and/or to the overlying metallization system, which is typically accomplished on the basis of "vertical" highly conductive metal-containing "plugs" formed in a dielectric material system that is formed above and laterally adjacent to the circuit elements of the device level. For sophisticated transistor architectures, which may include transistor elements formed on the basis of critical dimensions of 50 nm, 30 nm and even less, the contacting of transistor elements, and in particular of the drain and source regions, has been identified as a source of significant device failures and thus yield loss.

In view of the situation described above and with respect to the general tendency of further reducing lateral dimensions of sophisticated semiconductor devices, the present disclosure relates to techniques and semiconductor devices in which superior process techniques and/or device characteristics may be provided, while avoiding or at least reducing the effects of one or more of the problems identified above.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, according to the present disclosure, it has been recognized that significant device failures may originate from areas of pronounced surface topography, in which active regions of transistor elements or other circuit elements may be surrounded by isolation regions. That is, in particular in trench isolation regions, a significant material loss caused during the previous manufacturing steps may result in significant contact failures when respective contact elements may be slightly misaligned with respect to the drain and source regions positioned adjacent to the isolation regions. As will be discussed later on in more detail, significant material loss between the active region and the adjacent trench isolation region may result in challenging process conditions during the processes for preparing the semiconductor device for forming a contact level, thereby resulting in short circuits or unwanted conductive paths and the like upon forming contact elements, when the contact element may not exactly be centered on the drain and source regions and may land on the portion of the adjacent isolation region. Furthermore, the pronounced surface topography, i.e., the material loss, of the isolation regions may also increase the probability of creating deposition related non-uniformities, such as voids, which may be filled with conductive material upon forming the contact elements, thereby also contributing to significant contact failures in the form of conductive "channels" bridging two or more adjacent active regions.

Consequently, upon recognizing the material loss of the isolation regions as a main contributor to defects, the present disclosure is based on the concept that the material loss and thus the pronounced surface topography in the isolation regions adjacent to the circuit elements may be efficiently corrected by providing a dielectric material after completing the basic transistor configuration and prior to forming contact elements.

According to one illustrative embodiment disclosed herein, the present disclosure provides a method including forming a dielectric fill material above and laterally adjacent to a transistor element of a semiconductor device, wherein the transistor element comprises a gate electrode structure including a dielectric capping layer. The method further includes removing a portion of the dielectric fill material so as to expose a surface of the dielectric capping layer. The dielectric capping layer is removed on the basis of the exposed surface in the presence of a non-removed portion of the dielectric material. Additionally, the method includes forming a metal semiconductor compound in a semiconductor containing electrode material of the gate electrode structure.

According to a further illustrative embodiment, the present disclosure provides a method including forming a first transistor element in and above a first semiconductor layer that is formed on a buried insulating layer, wherein the first transistor element comprises a first gate electrode structure covered by a first dielectric capping layer. The method additionally includes forming a second semiconductor layer having a thickness that substantially corresponds to a combined thickness of the first semiconductor layer and the buried insulating layer. Moreover, the method includes forming a second transistor element in and above the second semiconductor layer, wherein the second transistor element comprises a second gate electrode structure covered by a second dielectric capping layer. Furthermore, a dielectric fill material is formed above and laterally adjacent to the first and second transistor elements. The method further includes removing a portion of the dielectric fill material so as to expose surface areas of the first and second dielectric capping layers. Additionally, the method includes removing the first and second dielectric capping layers on the basis of the exposed surface areas in the presence of a non-removed portion of the dielectric fill material.

According to still a further illustrative embodiment disclosed herein, the present disclosure provides a semiconductor device including a transistor element formed in and above a crystalline semiconductor layer that is formed on a buried insulating layer. The transistor element comprises a gate electrode structure and raised drain and source regions formed laterally adjacent to a portion of the gate electrode structure, wherein the raised drain and source regions include an upper portion comprising a metal semiconductor compound and a lower portion comprising a doped semiconductor material. The semiconductor device further includes a trench isolation region formed laterally adjacent to the drain and source regions and being filled with an oxide-based dielectric material. Furthermore, the semiconductor device includes an oxide-based dielectric fill material connecting to the oxide-based dielectric material of the trench isolation region and continuously extending to the upper portion of the drain and source regions.

BRIEF DESCRIPTION OF THE DRAWINGS

The disclosure may be understood by reference to the following description taken in conjunction with the accompanying drawings, in which like reference numerals identify like elements, and in which:

FIG. 3 schematically illustrates a cross-sectional view of a semiconductor device in accordance with further illustrative embodiments in which drain and source regions may be exposed so as to form a metal semiconductor compound therein prior to removing dielectric capping layers of respective gate electrode structures.

Figure 1A:
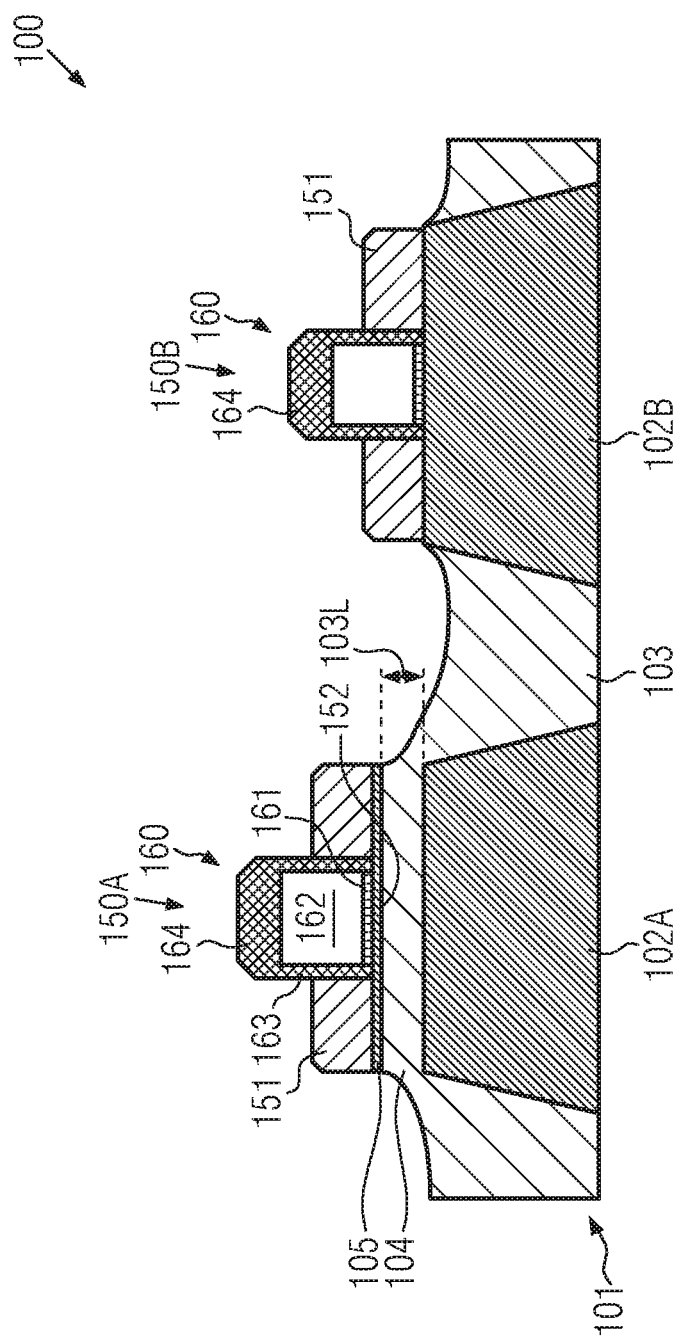
FIG. 1A schematically illustrates a cross-sectional view of a semiconductor device including a transistor element based on an SOI architecture and a transistor element based on a bulk architecture laterally enclosed by an isolation region having a pronounced surface topography due to material loss.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios and numerical properties of ingredients, reaction conditions and so forth used in the specification and claims are to be understood as being modified in all instances by the term "about."

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

Generally, the present disclosure is based on the recognition that contact failures in sophisticated semiconductor devices featuring a gate length of approximately 30 nm and less may not only contribute to increased yield loss and premature device failures but may represent a significant hindrance for further scaling of the lateral dimensions. That is, it has been recognized that, upon designing and forming semiconductor devices including transistor elements with planar architecture and critical dimensions, such as a gate length, of 30 nm and even less, the contacting of the drain and source regions may result in significant contact failures, for instance by shorting the active region of SOI devices with the bulk material and/or by forming a conductive path between adjacent active regions when filling the contact elements with an appropriate metal material, such as tungsten and the like.

A typical process flow for forming sophisticated semiconductor devices including transistor elements with planar transistor architecture having dimensions as specified above may typically include the following processes. First, an appropriate carrier material, such as a semiconductor substrate, may be provided and may have formed thereon an appropriate initial crystalline semiconductor layer that may act as a base material for forming therein and thereon respective sophisticated transistor elements. For example, as briefly discussed above, many adverse effects may be associated with the continuous reduction of lateral dimensions of transistor elements, and respective approaches and developments have been introduced in order to circumvent at least some of these adverse effects. For example, frequently, fully depleted transistor elements may be formed on the basis of an SOI (silicon- or semiconductor-on-insulator) architecture, in which a semiconductor material, such as crystalline silicon, crystalline silicon/germanium and the like, may be provided so as to enable the implementation of a fully depleted channel or body region. To this end, a respective low-doped or intrinsic semiconductor material may be used with reduced thickness, for instance in the range of 15 nm and even less, and may serve as a base material, which may be positioned on an appropriately designed buried insulating layer, such as a silicon dioxide layer and the like.

Moreover, moderately complex gate electrode structures may have to be formed so as to comply with reduced lateral dimensions, while nevertheless providing the required channel controllability, which may be accomplished by using appropriate gate dielectric materials, which, in sophisticated transistor elements, may include high-k dielectric materials in combination with respective barrier materials, typically followed by a semiconductor containing electrode material, such as amorphous and/or polycrystalline silicon, silicon/germanium and the like. Respective complex material systems in the form of high-k dielectric materials may be necessary, when increased capacitive coupling between the gate electrode and the channel region may be required, while, on the other hand, standard dielectric materials, such as silicon nitride, silicon dioxide and the like, may not provide a sufficiently high dielectric constant at a required physical thickness that may result in acceptable leakage currents.

The respective active regions of the semiconductor material, in which the channel regions and the drain and source regions of the transistor elements are formed, may be laterally bordered by appropriate isolation regions, typically provided in the form of trench isolation regions formed in an early stage of the overall process flow and being filled with a silicon dioxide-based dielectric material, wherein also lateral dimensions of these trench isolation regions may be appropriately adapted to the desired reduced lateral dimensions of the transistor elements.

During the relatively complex process sequence for preparing the semiconductor material of the thin initial semiconductor layer, forming the trench isolation regions, depositing the various materials of the gate electrode structure and respective mask layers for patterning the gate electrode materials and during the subsequent processes including cleaning and etch recipes, significant material loss may occur in the trench isolation regions, thereby forming a pronounced surface topography between the active regions and the trench isolation regions. Furthermore, typically in sophisticated planar transistor elements with fully depleted channel regions, raised drain and source regions may be formed on the basis of selective epitaxial growth techniques, in which highly doped semiconductor materials may be deposited on the initial thin semiconductor base material. The corresponding process sequence including masking, cleaning and other processes may also contribute to additional material loss in the trench isolation regions.

Although these material losses may be acceptable for completing the basic transistor structure, it turns out, however, that significant contact failures may be induced, when contact elements may not be precisely positioned within the active regions. That is, upon completing the transistor elements, which may include the formation of a metal semiconductor compound, such as nickel silicide, nickel/platinum silicide and the like, in the gate electrode structures and the raised drain and source regions, an appropriate material system may be deposited, for instance based on silicon nitride as an etch stop material, possibly also implementing a stress-inducing mechanism, followed by a silicon dioxide-based material. Upon forming contact elements, in particular to the raised drain and source regions, sophisticated lithography techniques may be applied, in which openings may be formed so as to extend through the silicon dioxide-based material, wherein, during a respective patterning process, the silicon nitride material may act as an etch stop layer. Thereafter, the etch stop layer may be opened by a respective selective etch process. It turns out, however, that, due to the pronounced surface topography in the neighborhood of the raised drain and source regions, the etch stop layer may be positioned at a height level that is comparable with the initial semiconductor layer and even with the buried insulating layer so that the etch process, due to the non-ideal etch selectivity, may not only etch through the silicon nitride layer but may also penetrate the underlying silicon dioxide-based material and may, therefore, extend down to the level of the buried insulating layer, thereby possibly bridging the base semiconductor material and the underlying bulk material, when the respective opening is positioned partially above the trench isolation region. For example, in sophisticated applications, the material loss in the trench isolation region may result in a recess that extends to a height level that corresponds to half of the thickness of the buried insulating material, which may have a thickness of approximately 20 nm and even less. Consequently, upon filling the slightly misaligned contact opening with an appropriate conductive material, such as tungsten and the like, the drain or source contact may be connected to the bulk material positioned below the buried insulating layer, thereby causing a fatal device failure.

Moreover, another failure mechanism, also caused by the pronounced surface topography, i.e., material loss, in the trench isolation region may be induced by the deposition of the material system for forming the contact level, for instance by depositing the silicon nitride etch stop material, which may result in respective voids or cavities due to a non-ideal gap filling capabilities of the deposition process, thereby forming respective channels, which may have a significant length and which may even bridge adjacent active regions when a respective gate electrode structure runs above one active region via the adjacent trench isolation region to another active region with the deposition-related voids being formed in the contact level material above the trench isolation region. Consequently, upon forming a contact opening in one active region, even when perfectly aligned, a corresponding "channel" positioned above the adjacent trench isolation region may be "opened." During the subsequent deposition of the tungsten material, at least a portion of the channel may be filled with the tungsten material, thereby forming a highly conductive connection between contact elements of adjacent active regions, which may also represent a catastrophic contact failure.

For these reasons, stringent constraints have to be placed on the design and the related deposition processes when forming the material system of the contact level, in particular for the silicon nitride etch stop material, while the tight design rules are meant to ensure that any overlap between contact elements to the drain and source regions and the laterally adjacent trench isolation region be avoided so as to prevent short circuits, as discussed above. In particular, the tight design rules for the contact elements may represent a significant hindrance for further device scaling.

Consequently, according to the principles of the present disclosure, the pronounced material loss may be corrected by providing an appropriate dielectric fill material prior to forming respective contact elements in order to increase process tolerance upon forming openings for contact elements and also for providing superior surface topography for depositing an etch stop material, such as a silicon nitride and the like. To this end, the present disclosure provides manufacturing techniques and corresponding semiconductor devices which may significantly reduce the risk of contact failures, while still ensuring a high degree of compatibility with presently established process strategies.

FIG. 1A schematically illustrates a cross-sectional view of a semiconductor device 100 in a moderately advanced manufacturing stage according to illustrative embodiments. As shown, the semiconductor device 100 may comprise a substrate 101 including therein an appropriate semiconductor material in crystalline form, such as a silicon material and the like. Respective crystalline semiconductor regions 102A and 102B are illustrated and may represent an upper portion of the respective crystalline semiconductor material of the substrate 101. It should be understood, however, that the substrate 101 may also comprise other materials and the semiconductor regions 102A, 102B may merely represent an upper crystalline portion of the substrate 101. The regions 102A, 102B may be laterally bordered or delineated by a respective trench isolation region 103, which may include any appropriate dielectric material, and in some illustrative embodiments, an oxide-based material, such as silicon dioxide, may be used for forming the trench isolation region 103.

A first transistor element 150A may be formed above the region 102A and may represent a planar transistor element of P-type or N-type formed on the basis of an SOI architecture, wherein a buried insulating layer 104 may be positioned between the semiconductor region 102A and a crystalline semiconductor layer 105, which may be formed of silicon, silicon/germanium and the like. As previously discussed, the semiconductor layer 105 may represent a base material for forming therein a channel region 152 of the transistor element 150A, which, in some illustrative embodiments, may represent a fully depleted channel region, thereby requiring a thickness of 15 nm and even less, such as 10 nm or less, while also an appropriate level of doping may be provided in the channel region 152, or even a substantially intrinsic semiconductor material may be used in at least a portion of the channel region 152, depending on the overall device configuration.

As discussed above, the channel region 152 may be controlled by a gate electrode structure 160 including a gate dielectric material 161, followed by an electrode material 162, which at least in an upper portion thereof may contain a semiconductor material, such as silicon and the like. It should be appreciated, and as also discussed above, that dielectric material 161 may also include a high-k dielectric material, if required for the transistor element 150A. Similarly, any metal-containing electrode material or barrier material (not shown) may be included in the electrode material 162. For example, titanium nitride, tantalum nitride and the like may frequently be used in combination with high-k dielectric materials. Furthermore, the gate electrode structure 160 may comprise sidewall spacers 163, for instance, including a silicon nitride material, and a dielectric capping layer 164, for example, formed of silicon nitride material, possibly in combination with other materials, such as silicon dioxide and the like. Furthermore, raised drain and source regions 151 may be provided so as to laterally enclose the gate electrode structure 160, at least above a respective active region, which is to be understood as a portion of the semiconductor layer 105 that is bordered in any lateral direction by the trench isolation region 103. It should be appreciated that, in a direction perpendicular to the drawing plane of FIG. 1A, the gate electrode structure 160 may extend beyond a respective active region and may run above a respective part of the trench isolation structure 103, thereby, for instance, extending to another active region of a transistor element and the like, as also previously discussed.

In the embodiment shown, a further type of transistor element 150B may also be provided, which may represent a transistor element formed on the basis of a "bulk" configuration, in which the semiconductor region 102B may act as a body region and thus may include a channel area for forming a transistor element based on non-SOI architecture. Basically, the gate electrode structure 160 of the transistor element 150B, as well as the drain and source regions 151, may have the same configuration as described in the context of the transistor element 150A and thus the same reference numerals are used.

As discussed above, upon forming the semiconductor device 100, a plurality of interrelated process techniques may have to be applied, some of which may significantly affect the trench isolation region 103, thereby causing a significant material loss, as for instance indicated by 103L. For example, respective cleaning processes may have to be applied during the various processes, thereby causing material removal in the trench isolation region 103.

It should be appreciated that well-established process strategies may be applied for forming the semiconductor device 100, wherein less stringent design rules and/or critical dimensions of reduced size may be applied, since negative effects of the material loss 103L in the trench isolation region 103 may be significantly reduced, as will be explained later on in more detail.

Figure 1B:
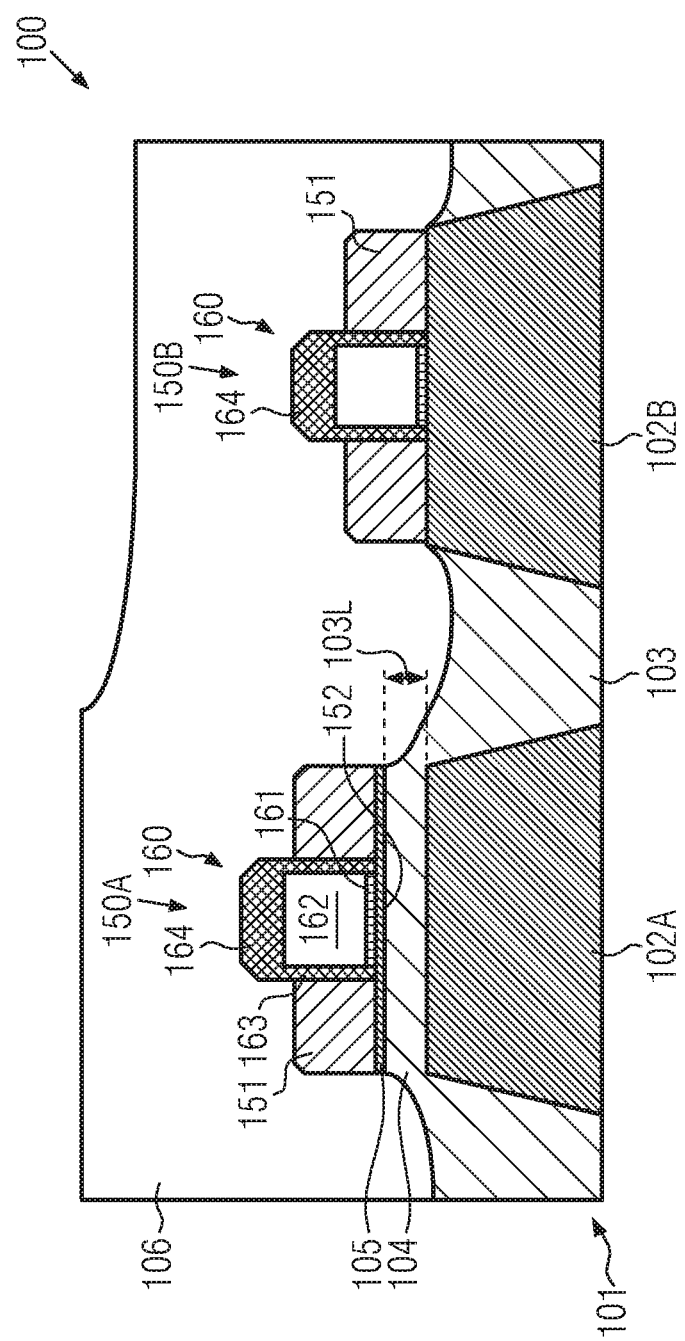
FIG. 1B schematically illustrates a cross-sectional view of the semiconductor device of FIG. 1A in a further advanced manufacturing stage, in which a dielectric fill material has been deposited.

FIG. 1B schematically illustrates a cross-sectional view of the semiconductor device 100 after the deposition of a dielectric fill material 106, which may be formed above and laterally adjacent to the first and second transistor elements 150A, 150B, thereby also filling the space above the trench isolation region 103 and substantially closing any voids caused by the material loss 103L. In some illustrative embodiments, the dielectric fill material 106 may be provided in the form of an oxide-based material, such as a silicon dioxide material, which may be formed on the basis of any appropriate deposition technique that has sufficient gap filling capabilities so as to reliably form a continuous material extending from the trench isolation region 103 to any desired height. For example, for a total height of the gate electrode structures of approximately 100 nm or less, the dielectric fill material 106 may be provided with a layer thickness of approximately 200 nm and less, for instance 150 nm and less.

It should be appreciated that due to the "missing" buried insulating material in the transistor element 150B, a respective topography and height difference may exist on the order of magnitude of the buried insulating layer 104. A corresponding height difference may be in the range of approximately 30 nm and less for a thickness of the buried insulating layer 104 of approximately 30 nm and less. In some illustrative embodiments, the dielectric fill material 106 may additionally include a further oxide-based material having a slightly different configuration, if considered appropriate. For example, a plurality of deposition techniques for silicon dioxide are available, which may allow a substantially fluid-like deposition behavior so as to efficiently level any underlying surface topography, such as the material loss 103L. For example, sub-atmospheric CVD (chemical vapor deposition) and the like may be applied, wherein appropriate precursors and process parameters for reliably filling the space between the gate electrode structures 160 may be readily determined by experiments and the like. If required, a different deposition technique may be applied for forming an upper portion of the dielectric fill material 106, for instance by using well-established TEOS (tetraethyl orthosilicate) based CVD techniques and the like.

Figure 1C:
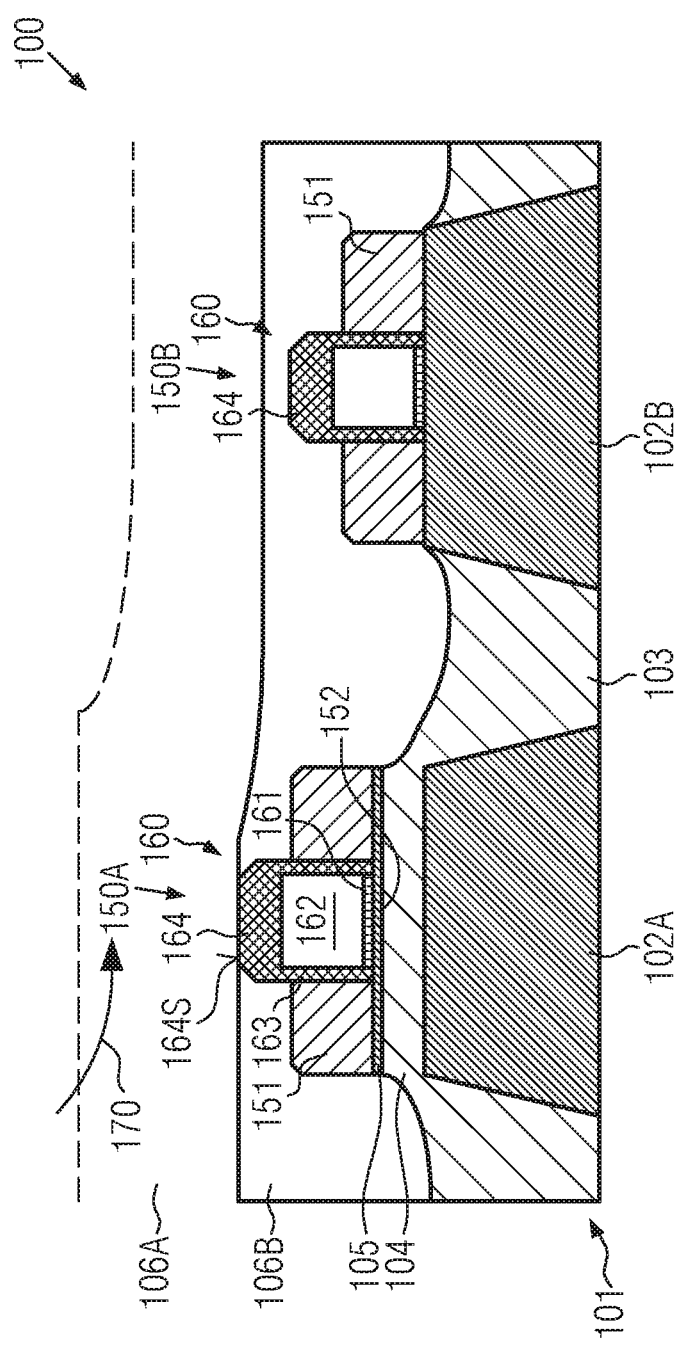
FIG. 1C schematically illustrates the semiconductor device after having performed a planarization process.

FIG. 1C schematically illustrates the semiconductor device 100 when subjected to a planarization process 170, such as a chemical mechanical polishing (CMP) process, in order to remove a portion 106A of the dielectric fill material 106, thereby leaving a non-removed portion 106B. During the planarization process 170, at least the dielectric capping layer 164 of the first transistor element 150A may be used as a stop layer, thereby finally exposing a surface 164S of the capping layer 164. On the other hand, the height difference between the first and second transistor elements 150A, 150B may still result in coverage of the capping layer 164 of the second transistor 150B, at least in densely packed device areas, since the "dishing" effect may not suffice for also exposing the capping layer of the transistor element 160B. In some illustrative embodiments, the planarization process 170 may thus be continued, possibly on the basis of different process parameters, so as to also expose the surface of the capping layer 164 of the second transistor element 150B. In other illustrative embodiments, the height difference between the first and second transistor elements 150A, 150B may be levelled, at least to a significant degree, in an early manufacturing stage, as will be explained with reference to FIG. 1D.

Figure 1D:
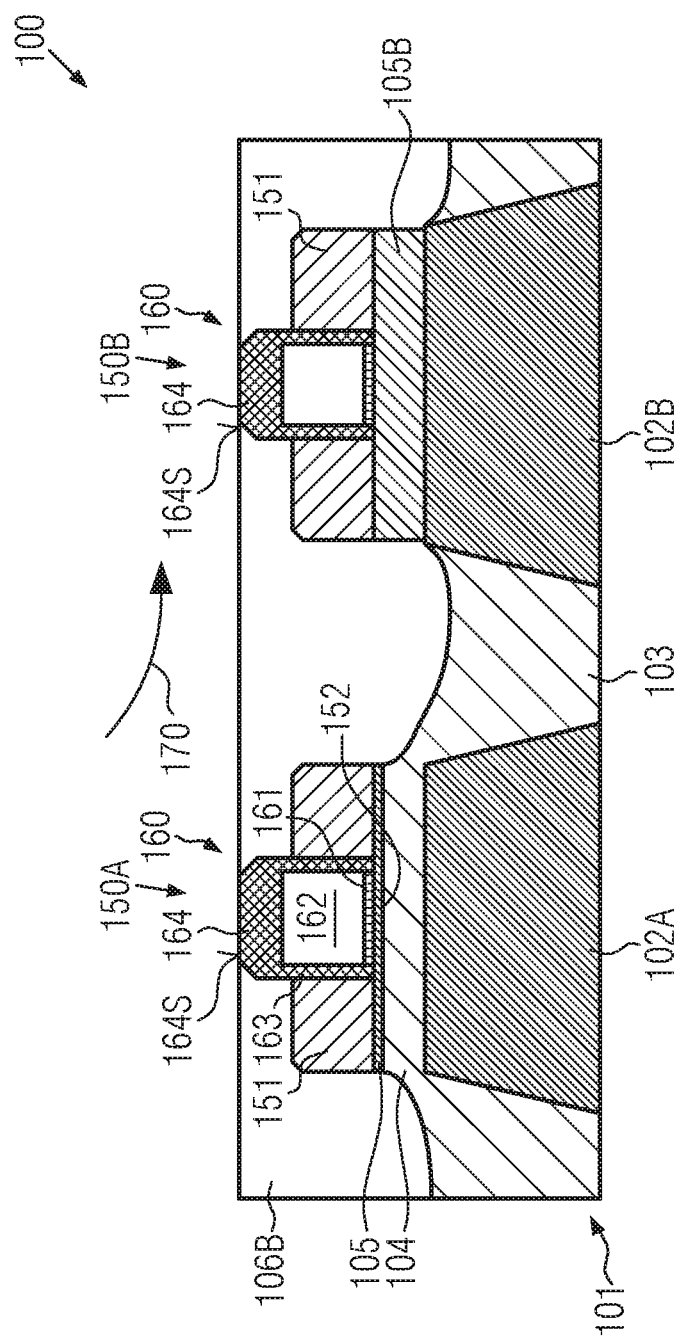
FIG. 1D schematically illustrates a cross-sectional view of a semiconductor device according to illustrative embodiments in which levelling of transistor elements formed on the basis of different architectures may be accomplished in an early manufacturing stage.

FIG. 1D schematically illustrates a cross-sectional view of the semiconductor device 100 according to illustrative embodiments in which the first and second transistors 150A, 150B may extend to substantially the same height level, which may be accomplished by forming an epitaxially grown semiconductor layer 105B on the semiconductor region 102B prior to forming other components of the transistor 150B. To this end, well-established epitaxial deposition techniques may be applied for forming the layer 105B in a crystalline form by using the underlying semiconductor region 102B as a seed material. The respective epitaxial growth process may be controlled so as to obtain a thickness of the layer 105B, which may substantially correspond to a thickness of the buried insulating layer 104, thereby substantially eliminating a height difference between the first and second transistors 150A, 150B. Consequently, after forming the semiconductor layer 105B with appropriate thickness, the further processing may be continued on the basis of well-established process techniques, wherein even further enhanced overall process conditions may be obtained due to the superior overall surface topography when forming the gate electrode structures and the raised drain and source regions.

Thereafter, the further processing may be continued by depositing the dielectric fill material, as discussed above, wherein the planarization process 170 may result in the exposure of the surface areas 164S of the dielectric capping layers of the first and second transistor elements 150A, 150B. It should be appreciated that respective minor variations in height between the first and second transistor elements 150A, 150B may readily be within the process margins of the planarization process 170.

Figure 1E:
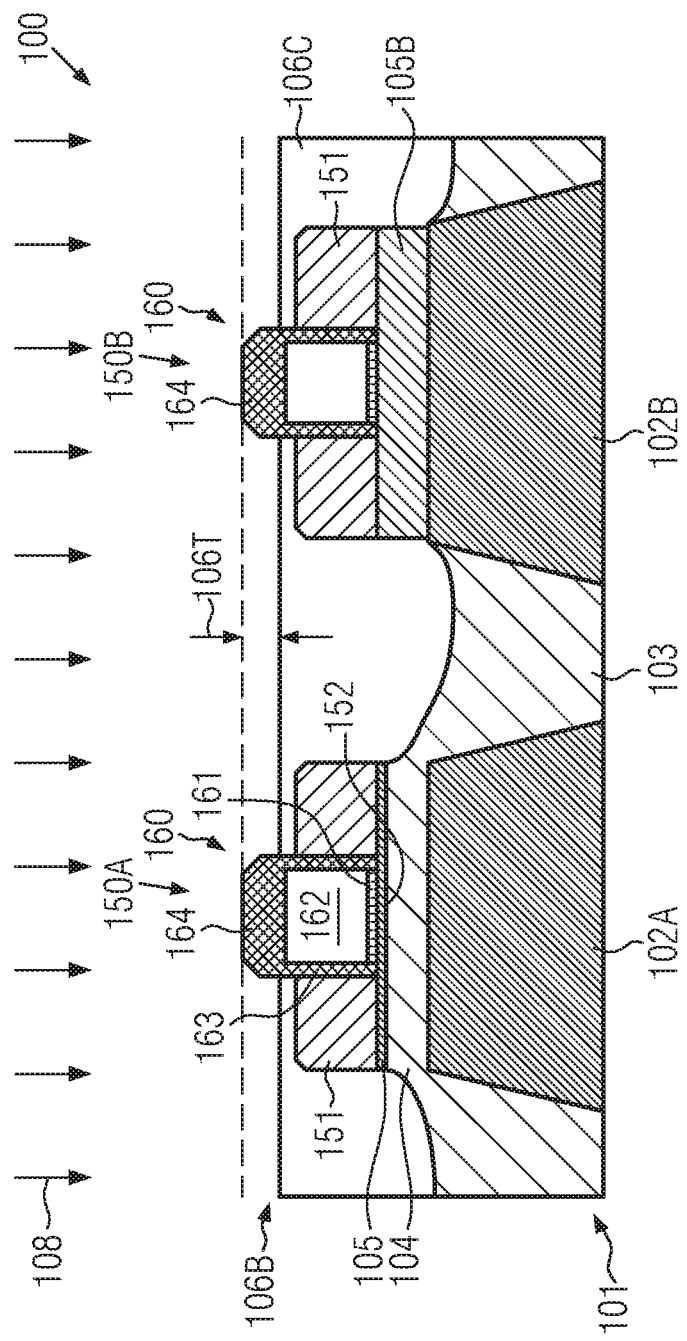
FIG. 1E schematically illustrates a cross-sectional view of the semiconductor device in a further advanced manufacturing stage according to illustrative embodiments.

FIG. 1E schematically illustrates the semiconductor device 100 in cross-sectional view according to further illustrative embodiments. As shown, the height of the portion 106B may further be reduced in order to expose an increased surface area of the dielectric capping layers 164, while preserving a portion 106C of the dielectric fill material so as to further cover the raised drain and source regions 151. For example, a thickness 106T of the removed part of the previous portion 106B may be approximately 25 to 15 nm, depending on the overall process and device requirements. To this end, a removal process 108 may be performed on the basis of well-established process recipes, for instance by plasma assisted etch recipes for removing oxide material selectively with respect to the material of the dielectric capping layers 164, while, in other cases, a wet chemistry may be applied, for instance in the form of diluted hydrofluoric acid (HF), thereby also providing a highly controllable removal of material in order to obtain the remaining portion 106C that reliably covers the raised drain and source regions 151. In some illustrative embodiments, the removal process 108 may comprise a substantially non-selective component so as to remove material of the portion 106B and the dielectric capping layers 164 with comparable etch rate, thereby possibly providing superior process conditions during the subsequent processing when removing the dielectric capping layers.

Figure 1F:
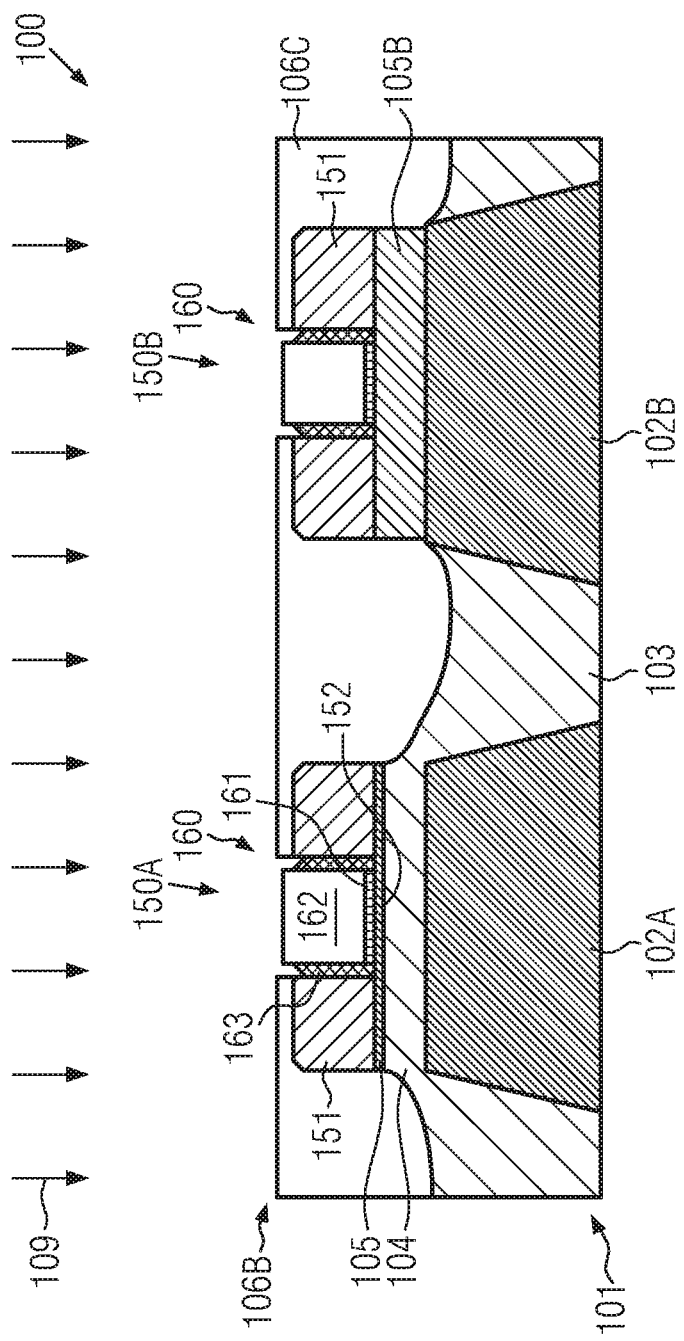
FIG. 1F schematically illustrates a cross-sectional view of the semiconductor device after removal of a dielectric capping layer, while covering raised drain and source regions by a non-removed portion of the dielectric fill material.

FIG. 1F schematically illustrates the semiconductor device 100 when subjected to a further removal process 109 that is appropriately designed so as to remove the dielectric capping layers 164 (see FIG. 1E), while still preserving a significant portion of the dielectric fill material 106C. Consequently, the raised drain and source regions 151 may substantially not be exposed to the reactive ambient of the process 109 and a top surface of the gate electrode structures 160 may be exposed. The removal process 109 may be performed on the basis of well-established recipes, such as a wet chemical process based on hot phosphoric acid, while, in other cases, a plasma assisted etch process may be applied, wherein the process 109 may have a pronounced etch selectivity with respect to and thus a reduced removal rate in the dielectric fill material 106C.

Figure 1G:
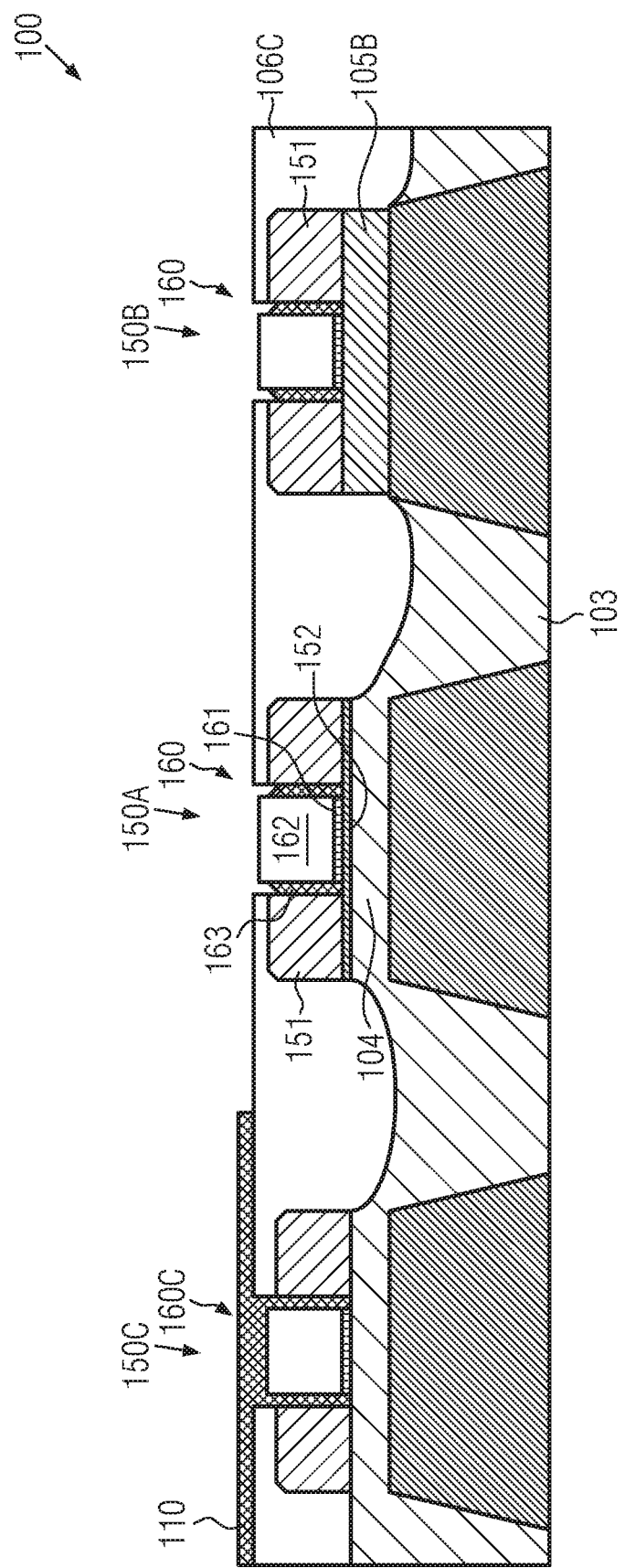
FIG. 1G schematically illustrates the semiconductor device according to further illustrative embodiments, in which the circuit element may be covered by a mask layer, while removing the dielectric capping layers of other transistor elements.

FIG. 1G schematically illustrates a cross-sectional view of the semiconductor device 100 according to still further illustrative embodiments. As illustrated, the semiconductor device 100 may comprise a circuit element 150C, which may represent any circuit element, such as a non-transistor element in the form of a resistor and the like, which may basically have a similar configuration as one of the transistor elements 150A, 150B, which, however, may have an electrode structure 160C that may have to be protected during a subsequent process sequence for forming a metal semiconductor compound in the first and second transistor elements 150A, 150B. To this end, after having removed a dielectric capping layer (not shown) of the electrode structure 160C, for instance on the basis of a process sequence as discussed above in the context of FIG. 1F, a mask layer 110, for instance comprising silicon nitride and the like, may be formed by well-established deposition techniques and may subsequently be patterned on the basis of well-established lithography techniques in order to mask the circuit element 150C. Forming the mask layer 110 may also result in a deposition of a respective mask material above the transistors 150A, 150B, wherein any such material may be efficiently removed during the patterning of the mask material in order to obtain the mask layer 110.

It should be appreciated that the respective process sequence for depositing and patterning the mask material for obtaining the mask layer 110 may be performed on a substantially planar surface topography due to the presence of the portion 106C of the dielectric fill material, thereby contributing to superior uniformity of the resulting processes. Contrary to conventional strategies, in which, typically, circuit elements requiring a masking during a silicidation process may have to be formed on the basis of a pronounced surface topography, a respective spacer material, for instance in the form of a silicon oxide material, may have to be provided prior to the deposition of the actual mask material, thereby resulting in increased process complexity. The strategy in accordance with illustrative embodiments of the present disclosure, on the other hand, enables the formation of the mask material without any further deposition of a spacer material. Moreover, any sensitive materials in the gate electrode structures 160, such as a high-k dielectric material and the like, may be reliably protected on the basis of the sidewall spacers 163 and in particular the portion 106C of the dielectric fill material.

Figure 1H:
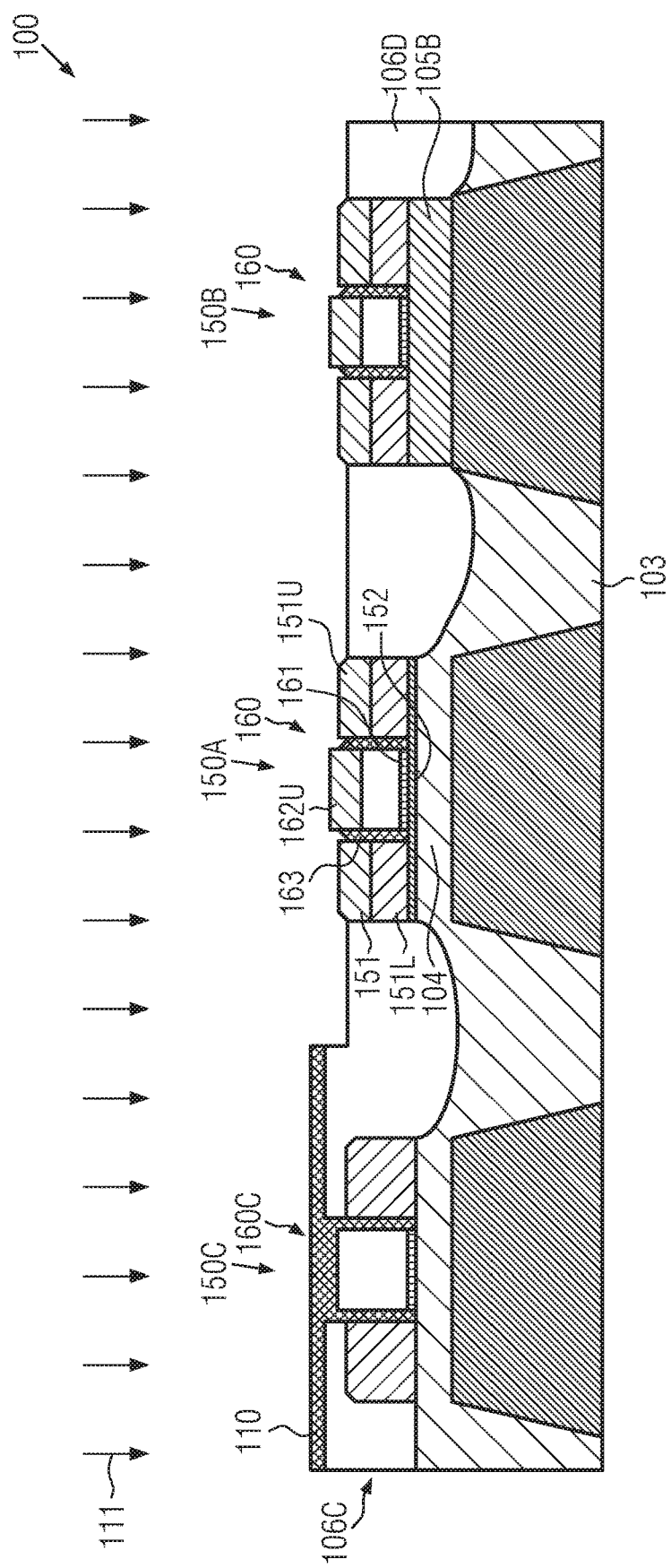
FIG. 1H schematically illustrates a cross-sectional view of the semiconductor device of FIG. 1G after having performed a common process sequence or two individually performed process sequences for forming metal semiconductor compounds in the drain and source regions and the gate electrode structures, according to illustrative embodiments.

FIG. 1H schematically illustrates the semiconductor device 100 in cross-sectional view in a further advanced manufacturing stage. As shown, the semiconductor device 100 may be subjected to a process sequence 111, during which the portion 106C of the dielectric fill material may be reduced in height so as to expose surface areas of the drain and source regions 151 of the first and second transistor elements 150A, 150B. To this end, any well-established etch recipes may be applied, for instance wet chemical cleaning recipes, which may also be used as a cleaning process for preparing the exposed surface areas of the drain and source regions 151 after exposure thereof and exposed surface areas of the gate electrode structures 160 with respect to a subsequent process sequence for forming a metal semiconductor compound. In other illustrative embodiments, the process sequence 111 may include a plasma assisted process for exposing the source and drain regions 151 and possibly also preparing the exposed surface areas for the subsequent metal semiconductor compound formation. In any case, a portion 106D may still be preserved and may provide superior surface conditions during the further processing of the semiconductor device 100, for instance during the further processes of the sequence 111. That is, the process sequence 111 may additionally comprise the deposition of any appropriate metal material, such as nickel, platinum and the like, followed by a heat treatment for initiating a chemical reaction between the metal deposited and the underlying semiconductor material in the gate electrode structures 160 and the drain and source regions 151. Thereafter any non-reacted metal material may be removed on the basis of well-established etch recipes, followed by a further heat treatment, if required, for stabilizing the previously formed metal semiconductor compound. During the entire process sequence 111, the circuit element 150C may be reliably protected by the mask layer 110.

Consequently, the drain and source regions 151 of the first and second transistor elements 150A, 150B may comprise an upper portion 151U formed of a metal semiconductor compound followed by a lower portion 151L, which may comprise a highly doped semiconductor material. Similarly, the gate electrode structures 160 of the first and second transistor elements 150A, 150B may comprise an upper portion 162U of a highly conductive metal semiconductor compound. Consequently, the remaining portion 106D of the dielectric fill material reliably laterally encloses the first and second transistor elements 150A, 150B and extends continuously to height level above the lower portion 151L of the drain and source regions 151. That is, the preserved portion 106D of the fill material, representing an oxide-based material in illustrative embodiments, extends in a continuous manner, i.e., not interrupted by a different material, such as a nitride material, from the trench isolation region 103 to a height level that is within the upper portion 151U, thereby providing a levelling of the surface topography that results in superior process conditions for the subsequent processing, i.e., for forming a contact level including respective contact elements.

Figure 1I:
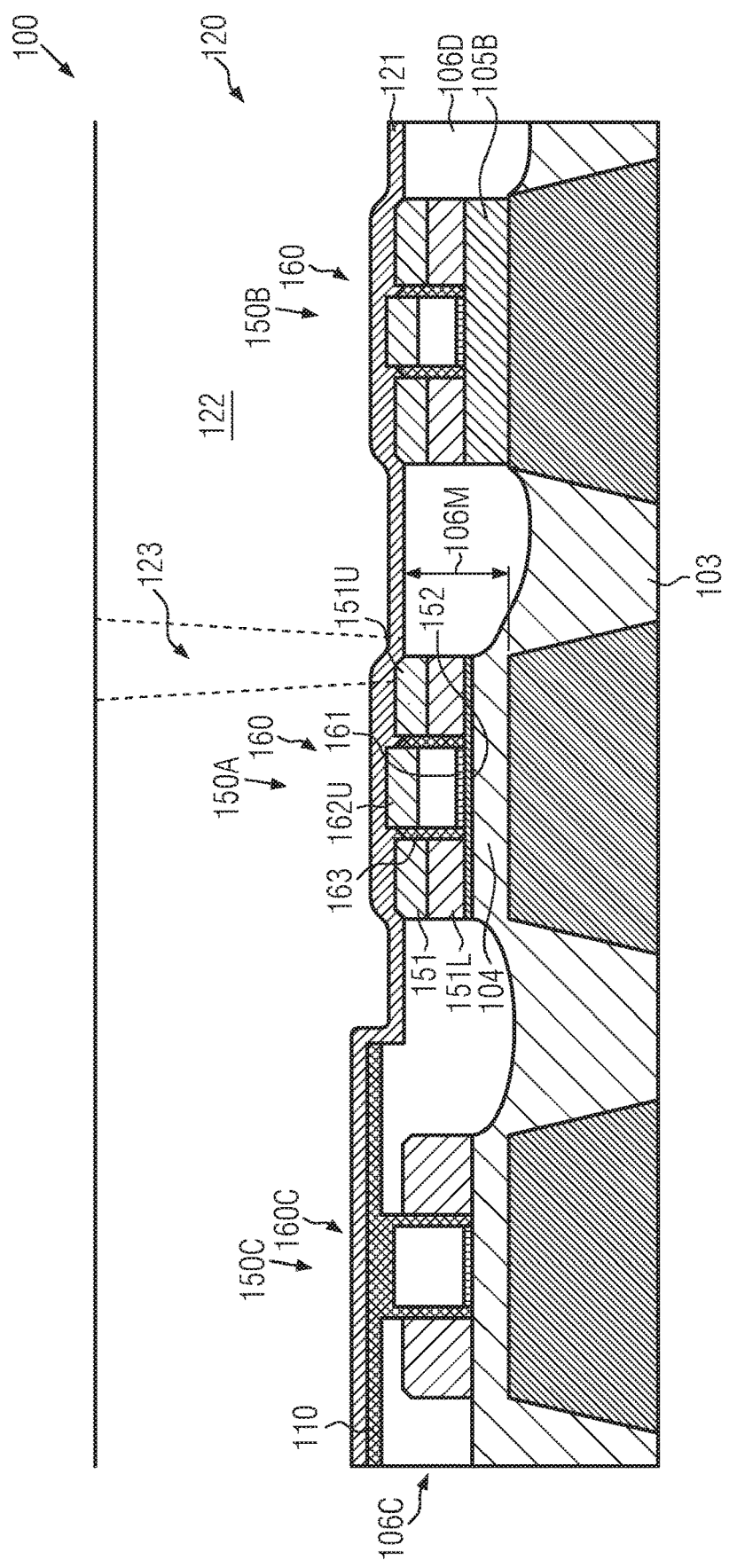
FIG. 1I schematically illustrates a cross-sectional view of the semiconductor device of FIG. 1H with contact elements landing on drain and source regions and above the adjacent trench isolation region with increased process margin with respect to misalignment due to the presence of the dielectric fill material.

FIG. 1I schematically illustrates the semiconductor device 100 in a further advanced manufacturing stage, in which a contact level 120 may be provided above the transistor elements 150A, 150B and the circuit element 150C. The contact level 120 may comprise appropriate dielectric material(s), such as an etch stop layer 121, for instance in the form of a silicon nitride material, possibly including an appropriate internal strain level, followed by a further material 122, such as a silicon dioxide material and the like. The materials 121, 122 may be formed on the basis of any well-established deposition techniques, wherein, as previously discussed, the significantly improved, i.e., smoothed or levelled, surface topography provided by the portion 106D of the dielectric fill material may result in superior process conditions upon depositing, in particular, the material 121, thereby substantially completely avoiding the formation of any deposition-related voids, which may conventionally be caused by the pronounced surface topography of the trench isolation region 103 in conventional approaches, as discussed above.

Moreover, contact elements 123 may be formed in the dielectric materials 122, 121 on the basis of well-established lithography and patterning strategies, wherein, contrary to conventional approaches, a process-related or an intentional, i.e., design-determined, overlap of one or more of the contact elements 123 with the trench isolation region 103 may be acceptable, since increased process margins 106M provided by the dielectric material 106D may be achieved during the formation of a contact opening for the contact element 123. That is, upon etching through the dielectric material 122, using the material 121 as an etch stop material, and further upon etching through the material 121 using the underlying fill material 106D as an etch stop material, penetration of the respective contact opening into and through the buried insulating layer 104, as may conventionally be the case due to the missing levelling material 106D, may be efficiently avoided, even for a non-ideal etch selectivity, due to the increased amount of "etch stop material" provided by the portion 106D according to the margin 106M. Moreover, as discussed above, since, in particular, the material 121 may be formed without the risk of creating deposition-related voids above the trench isolation region 103, the corresponding formation of conductive channels upon filling the contact opening 123 with a conductive material may be substantially avoided. Therefore, an overlap, irrespective of whether intentionally caused by design rules or unintentionally created by a process-related misalignment, of the contact openings 123 with the trench isolation region 103 may not result in a device failure and, thus, significantly relaxed design and process constraints may be achieved on the basis of the process techniques are described above.

Figure 2:
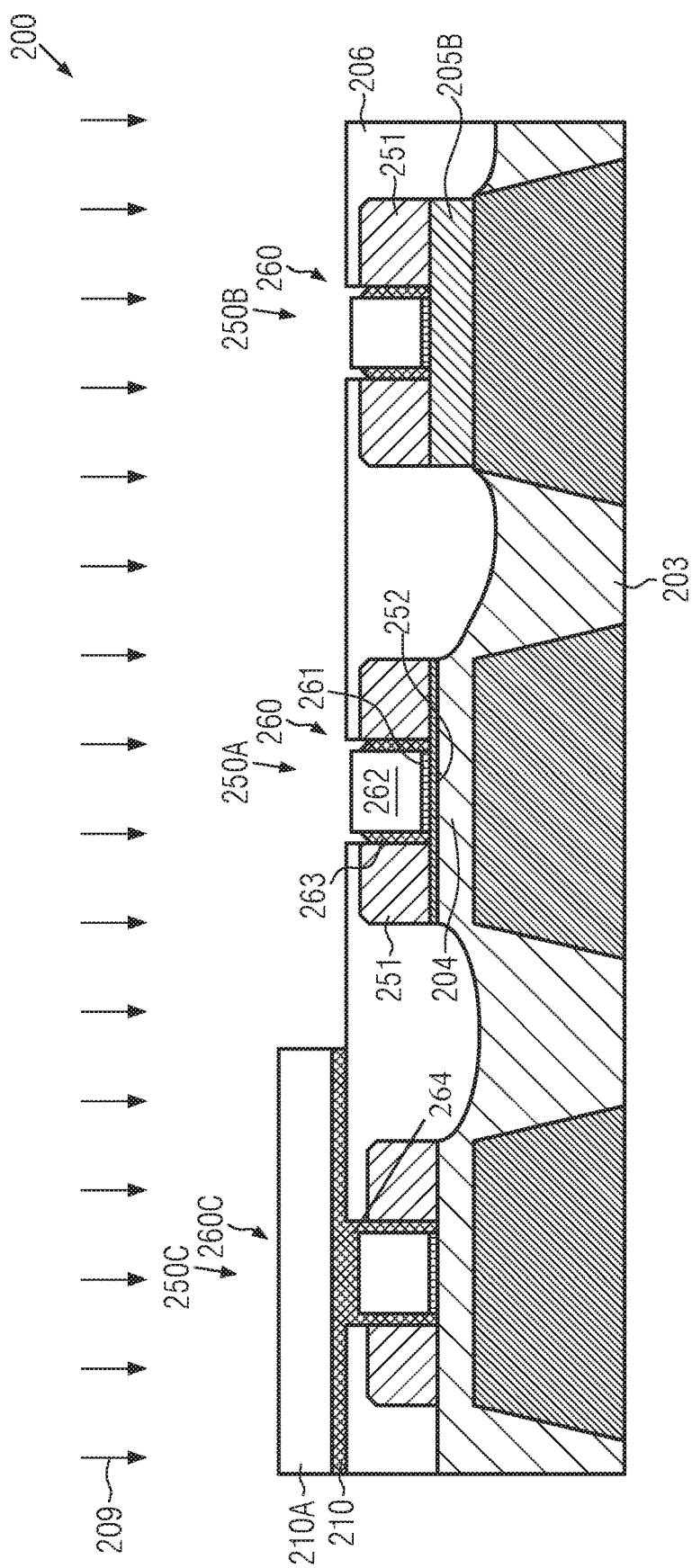
FIG. 2 schematically illustrates a cross-sectional view of a semiconductor device according to illustrative embodiments in which a masking regime for preventing dielectric capping layer removal on specific circuit elements may be combined with the removal of the dielectric capping layer in transistor elements.

FIG. 2 schematically illustrates a cross-sectional view of a semiconductor device 200 according to still further illustrative embodiments. As illustrated, the semiconductor device 200 may comprise a first transistor element 250A, a second transistor element 250B and a circuit element 250C. For example, the transistor elements 250A, 250B and the circuit element 250C may have substantially the same configuration as the respective devices as previously described in the context of the semiconductor device 100. Consequently, a corresponding description of these components may be omitted.

Moreover, a dielectric fill material 206 may be provided in a similar manner as previously discussed in the context of the semiconductor device 100. Furthermore, a mask layer 210, for instance in the form of a silicon nitride material, and a corresponding lithography mask 210A, for instance provided in the form of the resist material and the like, may cover the circuit element 250C. It should be appreciated that, as previously discussed, the gate electrode structures 260 of the first and second transistor elements 250A, 250B may comprise a dielectric capping layer, such as a dielectric capping layer 264 still formed on an electrode structure 260C of the circuit element 250C. In this stage, i.e., with any capping layers still in place, the semiconductor device 200 may be subjected to a process sequence 209 that is designed to remove portions of the mask material of the layer 210 (not shown) that are not covered by the lithography mask 210A. To this end, any well-established wet chemical and/or plasma assisted etch recipes may be applied, while the dielectric fill material 206 may still act as an etch stop material, thereby reliably protecting sensitive materials of the gate electrode structures 260. However, upon further continuing the process 209, also the exposed capping layers (not shown) of the gate electrode structures 260 may also be removed, while the lithography mask 210A may be consumed, however, still protecting to a certain degree the underlying mask layer 210. Thus, during the process 209, the gate electrode structures 260 of the first and second transistors 250A, 250B may be exposed while at the same time patterning the mask layer 210, wherein depending on the initial thickness of the lithography mask 210A and its etch resistivity, a certain portion may also be consumed, while still reliably covering the circuit element 250C. To this end, the initial thickness of the lithography mask 210A and the mask material for the layer 210 may be appropriately selected so as to preserve a desired thickness of the mask layer 210 after completing the process sequence 209. Appropriate parameters for the process 209 and the material thickness of the masks 210A and 210 may be determined on the basis of experiments and the like.

Thereafter, the further processing may be continued by applying a process sequence for exposing the drain and source regions 251 and forming respective metal semiconductor compound regions on the basis of a process sequence, such as the process sequence 111 of FIG. 1H.

Consequently, by applying the process sequence 209 for exposing the gate electrode structures 260, i.e., removing respective capping layers, and patterning the mask 210, overall process complexity may be reduced.

FIG. 3 schematically illustrates a semiconductor device 300 in an advanced manufacturing stage according to still further illustrative embodiments. As shown, the semiconductor device 300 may comprise a first transistor element 350A having a gate electrode structure 360 and a second transistor element 350B having a gate electrode structure 360 with basically the same configuration as the gate electrode structure 360 of the first transistor element 350A. Furthermore, it should be appreciated that the transistor elements 350A, 350B may have substantially the same configuration as previously discussed in the context of the semiconductor device 100. Consequently, the description of respective components may be omitted as appropriate.

Also, as discussed above, the semiconductor device 300 may comprise a portion of a dielectric fill material 306, which may be formed and processed as previously discussed in the context of the semiconductor device 100. In the manufacturing stage shown, the height of the dielectric fill material 306 may be reduced by well-established wet chemical or plasma assisted etch recipes, as also discussed above. Moreover, during a process sequence 311, the height of the dielectric fill material 306 may further be reduced so as to finally expose surface areas of drain and source regions 351. During the sequence 311, the dielectric capping layers 364 may still be present and may act as etch masks. The process sequence 311 may further comprise, after exposing surface areas of the drain and source regions 351, which may additionally result in the cleaning of the respective surface areas and preparation for a subsequent processing cycle for forming a metal semiconductor compound, the deposition of an appropriate metal species, such as nickel, platinum, cobalt and the like. The metal(s) deposited may be treated within the sequence 311 so as to initiate a chemical reaction for forming a metal semiconductor compound in the drain and source regions 351. For the process sequence 311, the respective process parameters, such as type of metal, the thickness of metal layer, parameters of the heat treatment and the like, may be specifically designed so as to obtain a desired material semiconductor compound, indicated as 351U, having a height that provides sufficient process margin so as to not extend down to sensitive device areas, such as the channel region of the first and second transistor elements 350A, 350B.

After having formed the metal semiconductor compound 351U in the drain and source regions 351 based on the process sequence 311, which may also include any post-treatments for stabilizing a desired phase of the metal semiconductor compound, a further process sequence 312 may be applied in order to form a desired type of metal semiconductor compound in the gate electrode structures 360. To this end, the sequence 312 may include any processes so as to remove the dielectric capping layers 364, while the upper portions 351U and the dielectric fill material 306 may act as etch stop material. Thereafter, the sequence 312 may include the deposition of any appropriate metal species, such as cobalt, nickel, platinum and the like, wherein the species may differ from the species as previously used for forming the metal semiconductor compound 351U. Thereafter, a chemical reaction may be initiated so as to convert any exposed semiconductor material of the gate electrode structures 360 into a metal semiconductor compound. It should be appreciated that during the process sequence 312, the process parameters may be selected so as to obtain the desired type and thickness of a metal semiconductor compound 362U of the gate electrode structures 360. That is, the process parameters may be selected such that the metal semiconductor compound 362U may extend to any desired depth without being restricted by a limited depth of respective metal semiconductor compound regions of the drain and source regions 351, which may be the case in strategies in which metal semiconductor compounds may be formed in a common process sequence for the drain and source regions 351 and the gate electrode structures 360. Thus, upon performing the metal semiconductor compound 362U so as to extend to a desired depth in the gate electrode structures 360, superior conductivity may be achieved, without substantially influencing the metal semiconductor compound regions 351U of the drain and source regions 351.

It should be appreciated that in some illustrative embodiments, particular materials and parameters of heat treatments may be selected so as to avoid undue modifications in the previously formed metal semiconductor compound regions 351U. For example, if initiation of a chemical reaction and stabilizing of a desired phase may be accomplished on the basis of reduced temperatures for the portion 362U compared to the portions 351U, the status of the portions 351U may substantially remain non-modified.

In still other illustrative embodiments, the order of the process sequences 311, 312 may be changed, i.e., the metal semiconductor compound 362U may be formed prior to the metal semiconductor compound 351U. To this end, the dielectric fill material 306 may be provided with sufficient height above the drain and source regions 351, while still exposing the dielectric capping layers 364 so that the drain and source regions 351 may remain covered by the material 306 after having removed the dielectric capping layers 364 and performing a respective cleaning process for preparing the subsequent formation of the metal semiconductor compound region 362U. Thereafter, during the process sequence 311, the drain and source regions 351 may be exposed and the respective metal semiconductor compounds 351U may be formed. Also, in this case, different types and/or different heights of the respective metal semiconductor compounds may be realized for the gate electrode structures 360 and the drain and source regions 351, respectively.

Thereafter, the further processing may be continued, as for instance described above in the context of the semiconductor 100, when forming respective contact elements.

As a result, the present disclosure provides techniques and semiconductor devices in which the superior process conditions may be obtained and/or relaxed design rules may be applied for forming contact elements, since an overlap with respective trench isolation regions is allowable. To this end, a dielectric fill material may be provided after completing the basic transistor configuration, thereby levelling the device topography and providing superior process conditions during the formation of the contact level and the contact elements. Moreover, a high degree of compatibility with existing process strategies may be preserved or overall process complexity may even be reduced by taking advantage of synergetic effects offered by the presence of the dielectric fill material.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a short-hand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
    forming a dielectric fill material above and laterally adjacent to a transistor element of a semiconductor device and a circuit element, said transistor element comprising a gate electrode structure including a dielectric capping layer, said circuit element having an electrode structure covered by a further dielectric capping layer;
    removing a portion of said dielectric fill material so as to expose a surface of said dielectric capping layer and a surface of said further dielectric capping layer;
    removing said dielectric capping layer and said further dielectric capping layer after removing said portion of said dielectric fill material, wherein a non-removed portion of said dielectric fill material remains laterally adjacent to said transistor element and said circuit element;
    masking said circuit element by a mask layer after removal of said dielectric capping layer of said gate electrode structure and said further dielectric capping layer of said electrode structure;
    forming a metal semiconductor compound in a semiconductor containing electrode material of said gate electrode structure, wherein said metal semiconductor compound in said gate electrode structure is formed in the presence of said mask layer so as to prevent formation of a metal semiconductor compound in said electrode structure; and
    removing a further portion of said dielectric fill material so as to expose surface areas of drain and source regions of said transistor element.

2. The method of claim 1, wherein said metal semiconductor compound in said semiconductor containing electrode material of said gate electrode structure and a further metal semiconductor compound in said drain and source regions are formed in a common process sequence.

3. The method of claim 1, wherein said metal semiconductor compound in said semiconductor containing electrode material of said gate electrode structure is formed in a first process sequence and a further metal semiconductor compound is formed in said drain and source regions in a second process sequence that is performed separately to said first process sequence.

4. The method of claim 1, further comprising forming a further metal semiconductor compound in said drain and source regions.

5. The method of claim 1, wherein removing a portion of said dielectric fill material comprises performing a planarization process on said dielectric fill material using said dielectric capping layer and said further dielectric capping layer as a stop material, the method further comprising recessing said dielectric fill material after said planarization process by performing at least one of a wet chemical and a plasma assisted removal process.

6. The method of claim 1, further comprising forming said transistor element in and above a semiconductor layer that is formed on a buried insulating layer and forming a further transistor element on the basis of a bulk semiconductor material in the absence of said buried insulating layer, said further transistor element having a further gate electrode structure covered by an another further dielectric capping layer, wherein said dielectric fill material is formed above and laterally adjacent to said further transistor element.

7. The method of claim 6, further comprising forming a crystalline semiconductor layer on said bulk semiconductor material, said crystalline semiconductor layer having a thickness substantially equal to a thickness of said buried insulating layer.

8. A method, comprising:
    forming a first transistor element in and above a first semiconductor layer, wherein said first semiconductor layer has a first thickness, said first semiconductor layer is formed on a buried insulating layer above a first semiconductor region, said buried insulating layer has a second thickness, and said first transistor element comprises a first gate electrode structure covered by a first dielectric capping layer;
    forming a second semiconductor layer above a second semiconductor region, wherein said semciconductor layer has a third thickness substantially equal to a sum of said first thickness and said second thickness;
    forming a second transistor element in and above said second semiconductor layer, said second transistor element comprising a second gate electrode structure covered by a second dielectric capping layer;
    forming a circuit element having an electrode structure covered by a third dielectric capping layer;
    forming a dielectric fill material above and laterally adjacent to said first and second transistor elements and said circuit element;
    removing a portion of said dielectric fill material so as to expose surface areas of said first and second dielectric capping layers;
    removing said first and second dielectric capping layers after removing said portion of said dielectric fill material, wherein a non-removed portion of said dielectric fill material remains laterally adjacent to said first and second transistor elements and said circuit element;
    forming a mask layer above said circuit element; and
    forming a metal semiconductor compound in said first and second gate electrode structures in the presence of said non-removed portion of said dielectric fill material, wherein said metal semiconductor compound in said first and second gate electrode structures is formed in the presence of said mask layer so as to prevent formation of a metal semiconductor compound in said electrode structure.

9. The method of claim 8, wherein said non-removed portion of said dielectric fill material covers drain and source regions of said first and second transistor elements.

10. The method of claim 8, wherein said surface areas of said drain and source regions are exposed by said non-removed portion of said dielectric fill material.

11. The method of claim 8, wherein masking said circuit element is performed after removing said first, second and third dielectric capping layers and prior to forming said metal semiconductor compound in said first and second transistor elements.

12. The method of claim 8, wherein masking said circuit element is performed prior to removing said first and second dielectric capping layers.

* * * * *